United States Patent
Ha et al.

(10) Patent No.: US 10,620,265 B2
(45) Date of Patent: Apr. 14, 2020

(54) COMPUTER-IMPLEMENTED METHOD FOR REAL-TIME TESTING OF A CONTROL UNIT

(71) Applicant: dSPACE digital signal processing and control engineering GmbH, Paderborn (DE)

(72) Inventors: Quang Ha, Paderborn (DE); Martin Aust, Bueren (DE); Frank Puschmann, Bad Driburg (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 1031 days.

(21) Appl. No.: 14/671,547

(22) Filed: Mar. 27, 2015

(65) Prior Publication Data

US 2015/0301110 A1    Oct. 22, 2015

(30) Foreign Application Priority Data

Apr. 17, 2014 (EP) .................................... 14165123

(51) Int. Cl.
  *G01R 31/317* (2006.01)
  *G05B 23/02* (2006.01)
  *G06F 30/398* (2020.01)

(52) U.S. Cl.
  CPC ... *G01R 31/31712* (2013.01); *G05B 23/0243* (2013.01); *G06F 30/398* (2020.01)

(58) Field of Classification Search
  CPC .................. G01R 31/31712; G05B 23/0243
  See application file for complete search history.

(56) References Cited

U.S. PATENT DOCUMENTS

2015/0040096 A1* 2/2015 Chang ................. G06F 17/5081
716/136

FOREIGN PATENT DOCUMENTS

| JP | 2006149035 A | 6/2006 |
|---|---|---|
| JP | 2006318200 A | 11/2006 |
| JP | 2009284637 A | 12/2009 |

OTHER PUBLICATIONS

C. A. Teixeira, D. G. Holmes, B. P. McGrath, P. Sykes and A. McIver, "A hardware/software co-simulation framework for power converter firmware development," 2014 IEEE 5th International Symposium on Power Electronics for Distributed Generation Systems (PEDG), Galway, 2014, pp. 1-8.*

(Continued)

*Primary Examiner* — Ajay Ojha
(74) *Attorney, Agent, or Firm* — Muncy, Geissler, Olds & Lowe, P.C.

(57) ABSTRACT

A method for real-time testing of a control unit with a simulator is provided. The simulator calculates a load current and a load voltage as electrical load state variables via converter control data and via an electrical load model that does not take into account current discontinuities caused by the converter, and transmits at least a portion of the load state variables to the control unit. A control observer is additionally implemented on the simulator that calculates at least the load current as a load state variable taking into account the converter control data and an observer load model. The observer detects a zero-crossing of the load current and a current discontinuity caused thereby from the calculated load current, and upon detection of a current discontinuity the observer calculates an electrical compensating quantity.

13 Claims, 8 Drawing Sheets

(56) References Cited

OTHER PUBLICATIONS

V. Sklyarov, I. Skliarova, B. Pimentel and M. Almeid, "Multimedia Tools and Architectures for Hardware/Software Co-Simulation of Reconfigurable Systems," 21st International Conference on VLSI Design (VLSID 2008), Hyderabad, 2008, pp. 85-90.*

Kiffe et al.; "Real-Time Simulation of Power Electronic Circuits based on Discrete Averaging Method", $37^{th}$ annual conference on IEEE industrial Electronics society, Nov. 7, 2011; pp. 1542-1547.

Japanese Office Action dated Jun. 11, 2018 issued by the Japanese Patent Office for corresponding Japanese application 2015-084787.

* cited by examiner

COMPUTER-IMPLEMENTED METHOD FOR REAL-TIME TESTING OF A CONTROL UNIT

This nonprovisional application claims priority under 35 U.S.C. § 119(a) to European Patent Application No. EP14165123.2, which was filed on Apr. 17, 2014, and which is herein incorporated by reference.

BACKGROUND OF THE INVENTION

Field of the Invention

The present invention relates to a computer-implemented method for real-time testing of a control unit with a simulator, wherein the simulator includes a simulator I/O interface, wherein the control unit includes a control unit I/O interface, and wherein the control unit and the simulator are connected to one another through their I/O interfaces via at least one data channel, and the control unit transmits converter control data to the simulator through the data channel, the simulator calculates a load current and a load voltage as electrical load state variables via the converter control data and via an electrical load model that does not take into account current discontinuities caused by the converter and transmits at least a portion of the load state variables to the control unit.

Description of the Background Art

Methods for control unit testing have long been known, and are used in many areas of control unit development when the control unit or the algorithms implemented on the control unit are to be tested for proper functionality without the need to place the control unit in its "real" operating environment.

In an exemplary case the control unit generates converter control data that are used to appropriately drive power switches of a converter, which are typically implemented by semiconductor switching elements (IGBT, IGCT, etc.). Converters are used to convert energy between an energy source and an electrical load. The converter can convert between DC and AC voltage, or between DC and AC current, by driving the power switches of the converter. If the energy source provides a DC voltage and drives a load with AC voltage via the converter, then the converter operates as an inverter; in the converse case—the energy source provides an AC voltage and uses it to drive a load with DC voltage via the converter—the converter operates as a rectifier.

Independently of the operating mode of the converter, the simulator in the application case examined here serves to recreate not only the converter with its power switches but also the electrical load powered by the converter. Accordingly, the control unit, which is physically present, is operated together with the simulator as "hardware-in-the-loop", wherein the simulator, aided by an electrical load model that mathematically simulates the electrical load and using the converter control data coming from the control unit, calculates the electrical state variables and if applicable transmits them back to the control unit. The hardware-in-the-loop test of the control unit implemented in this way permits reproducible, safe, automated, and thus ultimately economical test runs under laboratory conditions.

In the majority of application cases arising in practice, the electrical load has an inductive component that prevents a discontinuous change in the load current. So that the load current can nonetheless continue to flow in the same direction as beforehand after an actuation of the power switches of the inverter and the voltage reversal at the electrical load that may be associated therewith, diodes are usually connected to the power switches of the converter in an antiparallel manner, which diodes can continue to carry the current until the current becomes zero; the diodes then block.

For the case where the load current becomes zero when all power switches of the converter supplying the load are blocking, the current remains at zero until one of the supplying power switches is switched back into conductivity, which is to say a connection is established to the supplying negative or positive supply voltage. The persistence of the current at zero is generally referred to as a current discontinuity, and the operating mode is called discontinuous mode. Current discontinuities arise, for example, in the case of brushless DC motors and in the operating modes of inverters that deviate from complementary driving of the power switches. Moreover, current discontinuities occur in special cases, as for example short-circuit braking of permanently excited synchronous machines, but also in the event of electrical faults.

Even though the causes of the current discontinuity are immediately comprehensible in electrical engineering terms, and the resulting current curves are in principle relatively simple to calculate even when taking the current discontinuity into account, the calculation of state variables in converter-fed electrical loads under real-time conditions constitutes a considerable problem. The difficulty in the calculation of load state variables in discontinuous mode is that when current discontinuities arise, the load model undergoes a structural change, and then the load current can no longer be calculated using the load description according to the equations employed with free current paths. The numerical handling of such structural changes is not a fundamental problem, but frequently cannot be accomplished under real-time requirements.

If there is no need for the load model to be calculated in real time—one second of simulation time corresponds to one second of real time—which is to say that an essentially arbitrary amount of time is available, then it is possible, for example, to use calculation methods with a variable step size and zero-crossing detection to detect the internal switching times of the converter, hence for example the current discontinuity resulting from the onset of blocking by the diodes, with high accuracy, so that the load model can be calculated with high accuracy even when the current discontinuity is taken into account. Even though numerical methods with variable step size and numerical methods for zero-point detection, which for their part often operate iteratively, make it possible to maintain a predefined error limit, the time required for a calculation step can be subject to considerable variation, with the result that real-time conditions cannot be maintained with certainty.

Alternatively, if the numerical methods with constant step size that have proven their worth for real time simulations are used, then the calculation step size must be chosen very small in order to detect current zero-crossings with only a slight delay so that the inaccuracies caused by delayed accounting for internal switching events remain as small as possible. The ratio of the switching period duration of the converter to the step size of the real-time calculation should be in the region of >100, since otherwise internal switching events that result in a current discontinuity are only detected with a time resolution with a time resolution worse than 1% relative to the switching period duration of the converter. It is immediately evident that such oversampling under real-time conditions requires very rapid calculation of the load model within a simulation step on the simulator. At present, using conventional processors in simulators this can be implemented at most for very low switching frequencies in the range of 1 KHz, for example, (which would nonetheless mean a calculation step size of only 10 µs for the proposed hundredfold oversampling).

For the aforementioned reasons, so-called average-value models are frequently used for calculating the load state variables of an electrical load driven by a converter; in these models, the ability to account for and resolve internal switching processes within the switching period of the converter is intentionally foregone, and the behavior of the load state variables within a switching period of the converter is not of interest. In average-value models, the instantaneous value of the load state variable is not calculated at the sampling time; instead, what is calculated is the average value of the load state variable over the previous calculation interval. If the calculation period of the load model matches the switching period of the converter, the average-value model represents the average values of the load currents and voltages over the last switching period. One disadvantage of this method for calculating load state variables via an electrical model that does not take into account current discontinuities caused by the converter is an unavoidable calculation error in the event of current discontinuity. For example, such a calculation error can manifest itself as non-decaying residuals or as continuous oscillations about the current zero point, even when the actual load current actually would of necessity have come to a complete stop.

SUMMARY OF THE INVENTION

It is therefore an object of the present invention to perform real-time testing of a control unit with high precision, even when an electrical load model that does not take into account current discontinuities caused by the converter is used for simulating the electrical load.

The method according to an exemplary embodiment of the invention provides for real-time testing of a control unit with a simulator in that a control observer is additionally implemented on the simulator and the observer calculates at least the load current as a load state variable, taking into account the converter control data and with an observer load model. The observer can be designed such that it detects, based on the calculated load current, a zero-crossing of the load current and a current discontinuity caused thereby, and upon detection of a current discontinuity calculates an electrical compensating quantity such that when the compensating quantity is additionally applied to the electrical load in the load model, the calculation of the load current using the load model takes place with reduced error in the presence of current discontinuities.

The control observer additionally implemented on the simulator has the advantage that there is no need to adapt the load model of the simulator, which specifically does not take current discontinuities into account, yet information about an existent current discontinuity is nevertheless obtained through the observer load model. The observer can be calculated on another processor of the simulator or just on another core of the processor that is used in any case, for example. The observer can also be calculated on an FPGA (Field Programmable Gate Array), for example, which naturally entails speed advantages. Of course, if sufficient computing power is available, the observer load model can also be calculated on one and the same processor or even on one and the same core of the processor of the simulator together with the load model.

The calculation of the load model can be influenced by the calculation of the electrical compensating quantity in such a way that—without a structural change in the calculation having been needed—it delivers a result at the end of the calculation interval as though the current discontinuity had been taken into account from the beginning. The load model—for example in the form of a dynamic average-value model—can be left unchanged in its simplicity. Adaptation for discontinuous mode for the purpose of more precise calculation of the load state variables can be accomplished through a compensating quantity, for example through a voltage that increases or decreases the voltage that is applied numerically to the electrical load in normal operation as well.

According to an embodiment of the method, provision can be made for the calculation of the observer load model to take place in observer time intervals that are synchronized by external switching events of the converter. Thus, it is possible to arrange that the same sequence of switching events can always be implemented in the observer time intervals, which entails various advantages. For example, if the load only has an ohmic component and an inductive component, then the solution functions for the load current can readily be specified explicitly. As a function of the converter control data, different voltages are present at the load, which result in current behaviors that can be described by exponential functions. During each switching period of the converter, the power switches pass through various combinations of conductive and blocking states; the behavior of the load current for each interval can be directly described by an explicit mathematical expression, which makes zero-point detection of the current possible as well. Even in the more general case that the electrical load is an RLC network, the electrical load is described by linear differential equations for which it is possible to specify closed functions as solution functions that can be used for the observer load model; in this case there is no need to use numerical methods for calculating the observer load model.

In an alternative embodiment of the method, provision can be made for the observer load model to be an average-value model, which for its part initially does not take into account internal switching events and hence does not take into account a structural change in the model. The observer load model can also be calculated through the use of numerical methods, exactly like the load model that is present in any case, for example through the backward Euler method. Then, provision can be made for the calculation of the observer load model to be driven by load state variables calculated with the load model. This means that at the beginning of a calculation interval the results of the load model are used for the load state variables and serve as the starting point for the calculation of the observer load model. This is advantageous especially when it is taken into account that the load model can be calculated with improved precision on the basis of the compensating quantity calculated by the observer model. Furthermore, it is not strictly necessary for all state variables that are determined with the load model to be calculated from within the observer model, because the task of the observer load model resides essentially in calculating the compensating quantity or the compensating quantities, but not primarily in calculating the load state variables for whose calculation the load model is used.

The object derived at the outset is further attained indirectly through a computer program product with a computer program that has software for carrying out the above-described method when the computer program is executed with, for example, a simulator.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
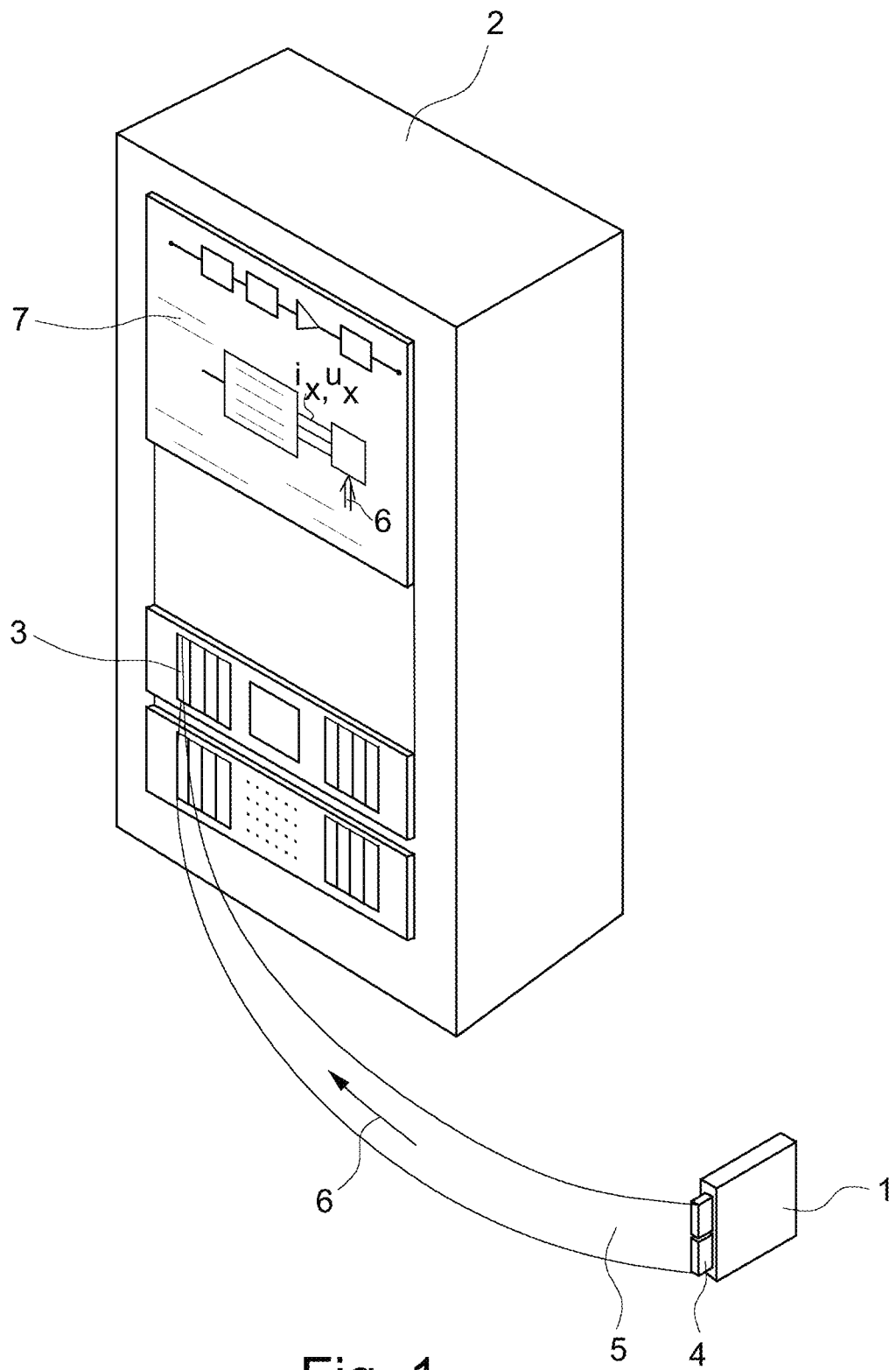
FIG. 1 schematically shows a control unit and a simulator for computer-implemented execution of a real-time control unit test.

FIG. 1 illustrates, firstly, a technical device arrangement with which a method for real-time testing of a control unit 1 with a simulator 2 can be carried out. The simulator 2 includes a simulator I/O interface 3, and the control unit 1 includes a control unit I/O interface 4. The control unit 1 and the simulator 2 are connected to one another through their I/O interfaces 3, 4 by a data channel 5. The data channel 5 can be implemented through a single serial data line, but it can also be implemented over multiple parallel data lines; this is not important in the present case. What is important is that the control unit 1 and the simulator 2 can exchange data over the data channel 5.

The control unit 1 is a control unit to be tested, on which an algorithm for driving a converter is implemented in the present case. Because of its programming, and if applicable as a function of external data that the control unit 1 obtains through its control unit I/O interface 4, the control unit 1 determines converter control data 6—in the form of pulse-width-modulated signals (PWM signals), for example—and transmits them to the simulator 2. The simulator 2 contains neither an actual converter nor an actual load; instead, both components are recreated in the simulator 2 through a mathematical model, which is referred to here as the electrical load model 7. The structure illustrated in FIG. 1 corresponds to a hardware-in-the-loop test of the control unit 1; hence, the environment of the control unit 1 is reproduced by the simulator 2 and the calculations within the simulator 2.

The load model 7 is a model of a type that does not take into account a current discontinuity caused by the converter; in the case shown, the load model 7 is a dynamic average-value model of an ohmic/inductive load. With the load model 7, a load current $i_x$ and a load voltage $u_x$ are calculated as electrical load state variables. At least a portion of the load state variables are transmitted through the data channel 5 from the simulator 2 back to the control unit 1, so that in total a closed-loop control system is implemented.

Figure 2:
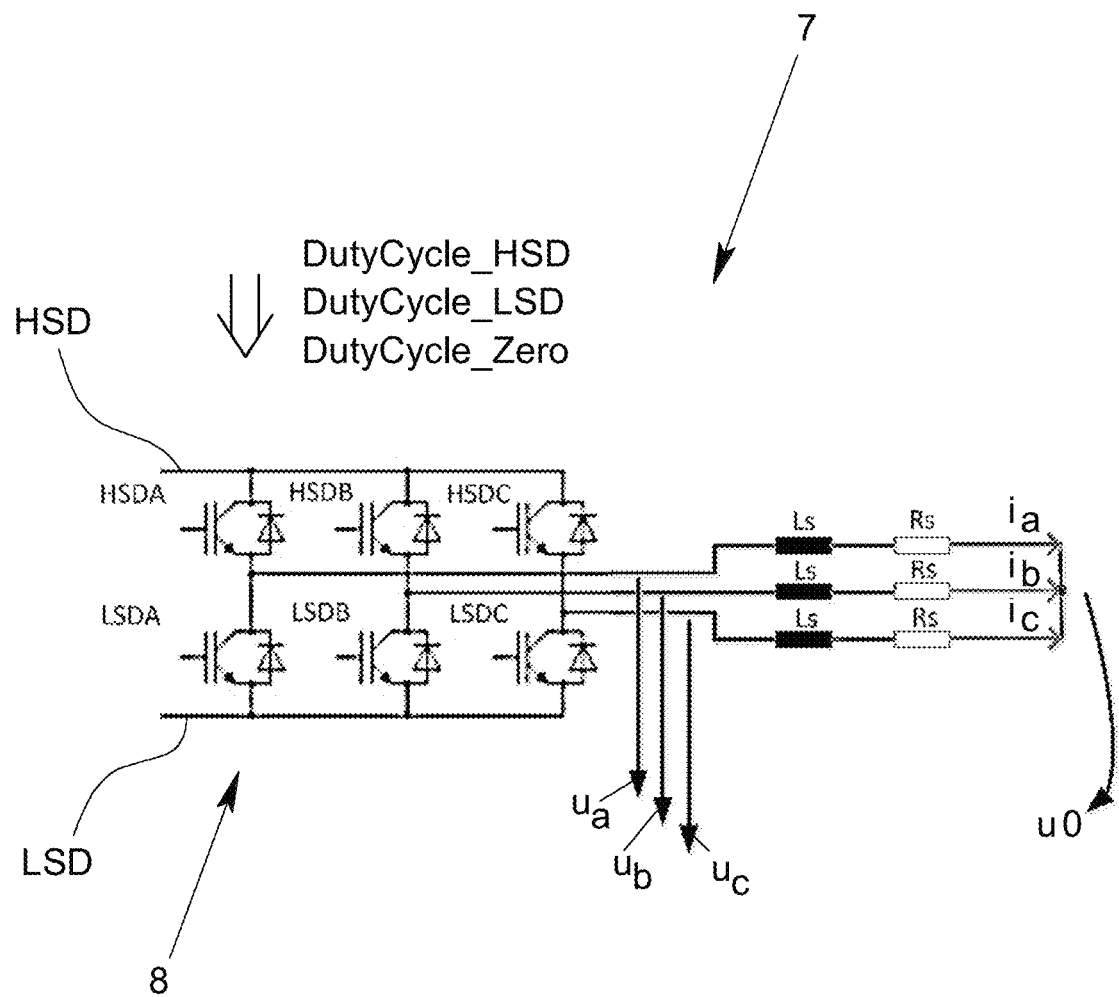
FIG. 2 schematically shows an electrical schematic diagram of a converter with an electrical load (three-phase)

FIG. 2 shows, in the form of an electrical schematic diagram, the components on which the calculation of the electrical load state variables by the simulator 2 is based. In this case the converter 8 is of three-phase design and the load model 7 accordingly consists of three phases (labeled with the subscripts a, b, c), each of which is composed of ohmic/inductive loads $R_s$, $L_s$. The load could be an asynchronous machine with a central neutral point, for example.

Each phase of the converter 8 consists of two power switches, HSDX, LSDX, through which the relevant load phase is connected to the positive DC supply voltage HSD (High Side Drive) and the negative DC supply voltage LSD (Low Side Drive). The power switches here are labeled HSDA, LSDA; HSDB, LSDB; and HSDC, LSDC for simplicity. The power switches of the converter 8 are switched via converter control data 6, which are present here as pulse-width-modulated signals (PWM signals). The PWM signals are characterized in a known manner by their duty cycle, described in FIG. 2 as DutyCycle_HSD, DutyCycle_LSD, and DutyCycle_Zero. These data are transmitted for each phase. The converter control data 6 determine which of the power switches HSDX, LSDX are switched on or block, so it is evident from analysis of the converter control data 6 which phase voltages $u_a$, $u_b$, $u_c$ are present at the relevant load phases. In the case of the ohmic/inductive loads shown in FIG. 2, the load model 7 consists of linear differential equations for each phase. For known supply-side voltages $u_x$, the corresponding load currents $i_x$ (where x=a, b, c) can be calculated.

Figure 3:
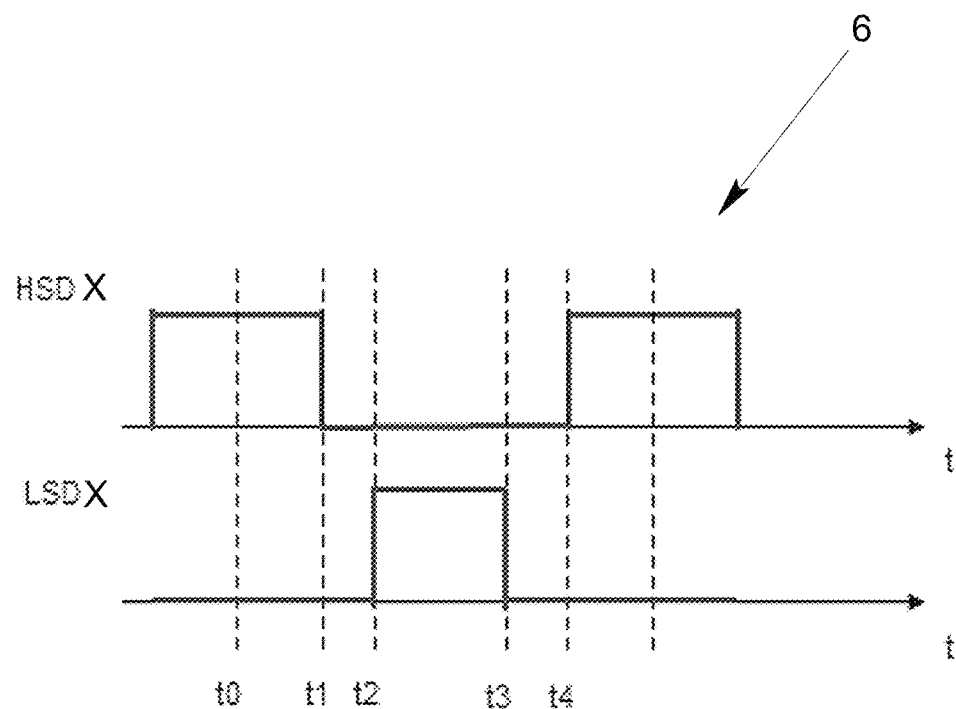
FIG. 3 shows a behavior of converter control signals for driving power switches of the converter (single-phase)

FIG. 3 shows by way of example possible converter control data 6 for one phase in the form of PWM signals that switch the power switches HSDX, LSDX. The PWM signals as converter control data 6 shown in FIG. 3 result in the following duty cycles for the positive and negative supply voltage (HSD, LSD) and for the zero intervals during which none of the power switches is switched on:

$$\text{DutyCycle\_HSD} = \frac{t_1 - t_0}{T_{PWM}} + \frac{t_5 - t_4}{T_{PWM}}$$

$$\text{DutyCycle\_LSD} = \frac{t_3 - t_2}{T_{PWM}}$$

$$\text{DutyCycle\_zero} = \frac{t_2 - t_1}{T_{PWM}} + \frac{t_4 - t_3}{T_{PWM}}$$

In the equations, $T_{PWM}$ represents the period of the PWM signal. In continuous mode, which is to say when either at least one power switch HSDX, LSDX is switched on or at least one of the anti-parallel connected diodes is still conductive in one load phase, the load current in each phase is described by the following differential equation (x=a, b, c):

$$L_S \frac{di_x}{dt} = u_x - R_S i_x - u_0$$

Figure 4:
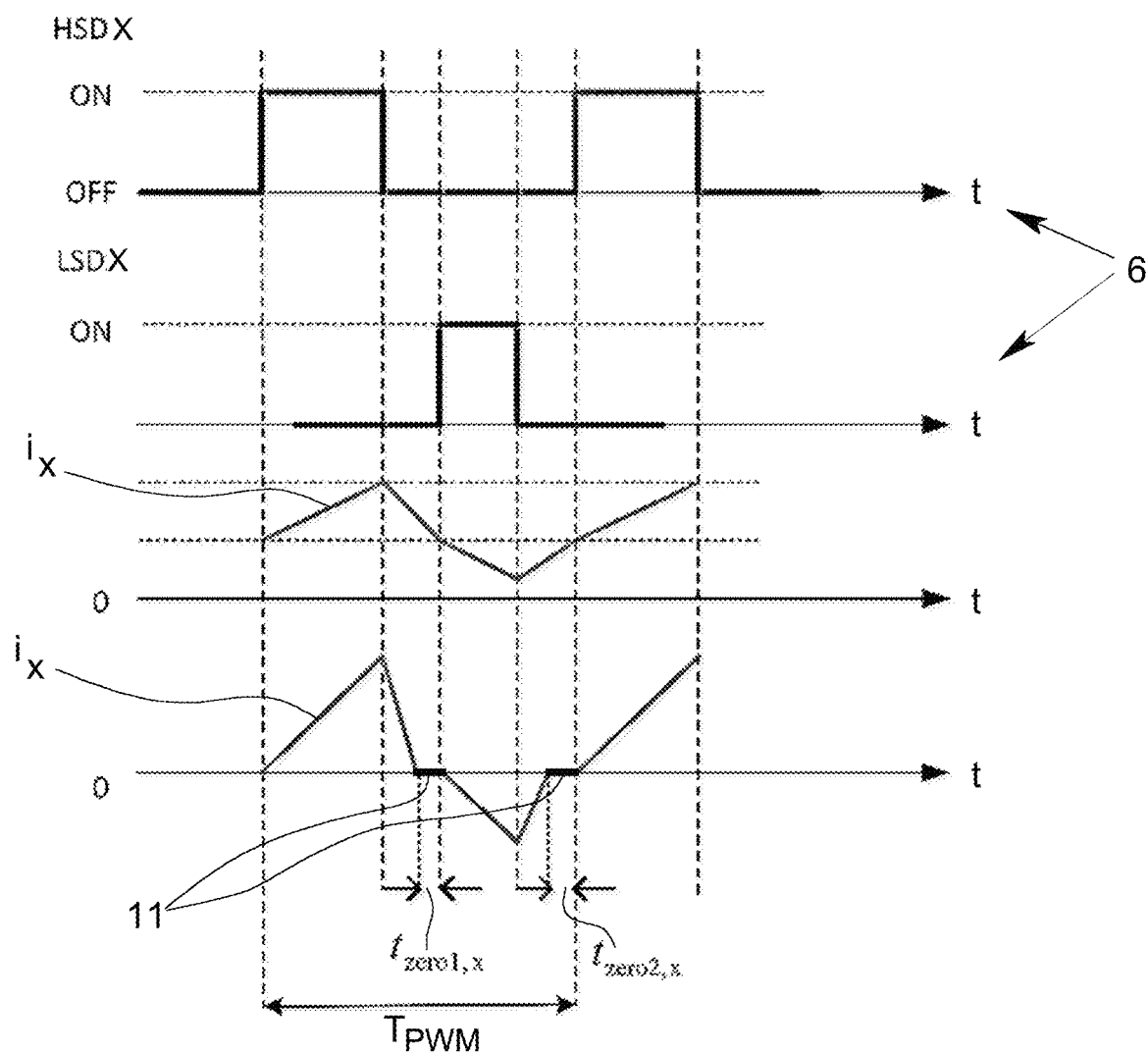
FIG. 4 schematically shows converter signals and load currents that arise with and without current discontinuities.

The two upper partial figures of FIG. 4 once again show, for one load phase, converter control data 6 in the form of PWM signals. Possible curves of load currents $i_x$ are shown below these. In the upper curve of the load current $i_x$ the current always remains positive, so that the current flow is still ensured even when both power switches block, which is to say that both HSDX and LSDX block (the associated PWM signals are in the "off" state). In the lower curve of the load current $i_x$, however, what is called a current discontinuity arises, in which the load current $i_x$, which was previously carried by the freewheel diodes, see FIG. 2, becomes zero. In this case the load current $i_x$ must of necessity remain at zero until one of the power switches HSDX, LSDX is switched on again. The current discontinuity time intervals are labeled in FIG. 4 as $t_{zero1}$ and $t_{zero2}$. The occurrence of this current discontinuity is critical in that the load model 7, which in accordance with its prerequisites does not take into account a current discontinuity caused by the converter 8, permits only an erroneous and imprecise calculation of the load state variables and in particular of the load current $i_x$.

The aforementioned property is possessed in common by all load models 7 that are used as a basis here. Typical load models 7, in which the discontinuous mode of converters is not taken into account and, moreover, cannot be taken into account in practice, are the so-called average-value models, in which the behavior of the load state variables to be calculated within, e.g., a PWM interval, is not of interest, and which calculate and use in their calculations the average values of the load state variables.

Figure 5:
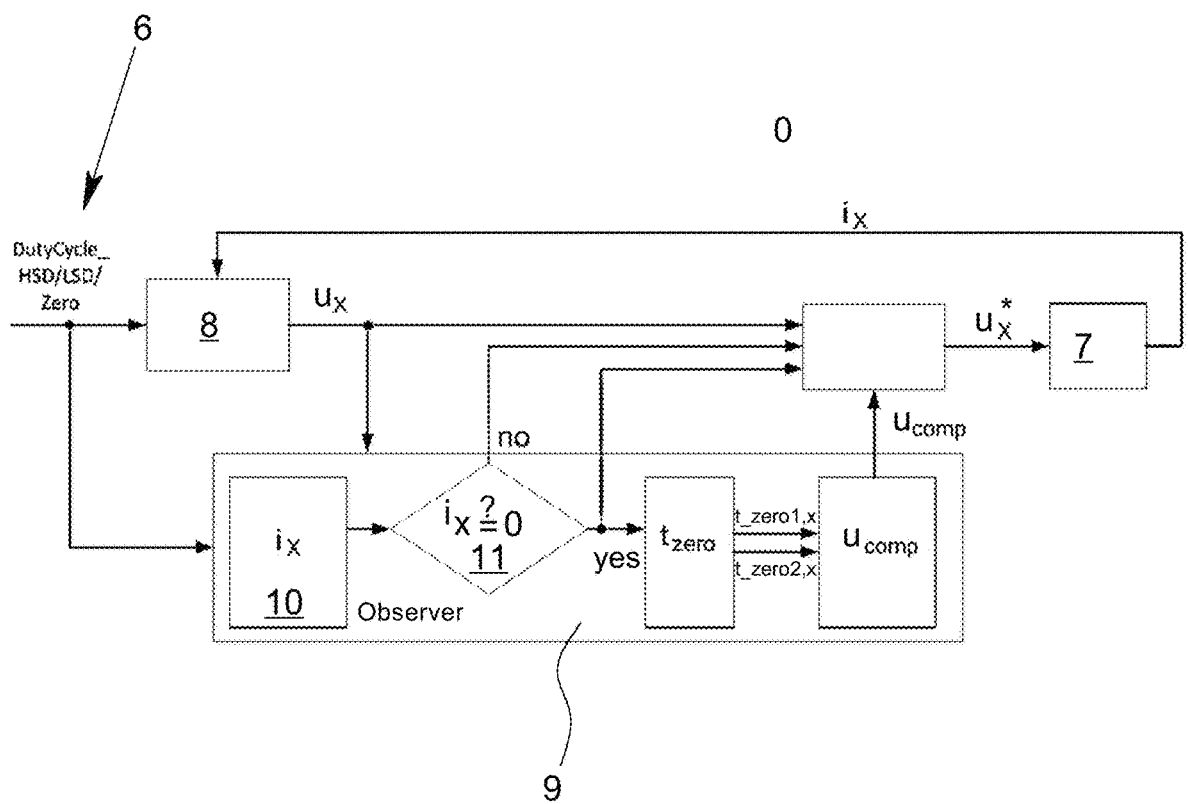
FIG. 5 shows a block diagram of the method according to an exemplary embodiment of the invention with an observer for identifying current discontinuities and calculating compensating quantities.

FIG. 5 shows an enhancement of the method known per se from the prior art and described above that is distinguished in that a control observer 9 is additionally implemented on the simulator 2; the observer 9 calculates at least the load current $i_x$ as a load state variable taking into account the converter control data 6 (here in the form of DutyCycle_HSD/LSD/Zero) and with an observer load model 10; the observer 9 detects a zero-crossing of the load current $i_x$ and a current discontinuity 11 caused thereby based on the calculated load current $i_x$; and upon detection of a current discontinuity 11, the observer 9 calculates an electrical compensating quantity $u_{comp}$ such that when the compensating quantity $u_{comp}$ is additionally applied to the electrical load in the load model 7, the calculation of the load current $i_x$ using the load model 7 takes place with reduced error in the presence of current discontinuities 11. In the example embodiment shown, both the normal phase voltage $u_x$ and the compensating voltage $u_{comp}$ contribute to the resulting voltage $u_x^*$.

Hence, the concept includes leaving the load model 7 unchanged in its simplicity, which is to say not taking into account current discontinuities caused by the converter 8, but calculating a compensating quantity such that when the electrical supply quantity increased or decreased by the compensating quantity $u_{comp}$ is applied to the electrical load within the existing load model 7, the same result is achieved as if the load model 7 had taken a current discontinuity into account—for example via a structural change in the equations to be calculated.

The principle of compensating for errors of the load model 7 in the event of current discontinuity by calculating a compensating quantity and additionally applying the calculated compensating quantity $u_{comp}$ to the electrical load in the load model 7 is completely independent of the load modeled by the load model 7. The modeled load is typically an electric machine, in particular a commutated machine, an asynchronous machine, or a synchronous machine, wherein the phase or phases of the machines are typically reproduced by an RLC network, and are mathematically reproduced to a good approximation by at least one RL network.

In the example embodiment shown in FIG. 5, the electrical load is described in the observer load model 10 by linear differential equations that represent an RL network. The observer load model 10 is calculated by a numerical method, here using the backward Euler method. As is evident from FIG. 5, the calculation of the observer load model 10 is driven by load state variables $u_x$ that come from the load model 7.

The observer 9 detects a zero-crossing of the load current $i_x$ by a change in sign of the calculated load current $i_x$, so that a current discontinuity 11 caused thereby can be inferred and this current discontinuity 11 can be detected. If values of the load current $i_x$ are calculated with the aid of the observer load model 10 only at the end of each observer time interval underlying the calculation, then the detection of a current discontinuity 11 takes place by analyzing the values of the load current $i_x$ at the beginning and at the end of the observer time interval, wherein it is extracted as additional information from the converter control data 6 whether the zero-crossing of the load current $i_x$ has taken place in an interval during which the power switches supplying the load phase were blocking, so that discontinuous mode is actually present.

It is evident from FIG. 5 that the load model 7 is calculated without any adaptation whatever in the case where no current discontinuity is detected; the additional calculation of the compensating quantity $u_{comp}$ is then omitted. The load model 7 then has applied to it the voltage $u_x$ that results in the "normal" case. However, if a zero-crossing of the load current $i_x$ during the blocked interval of the power switches is detected, a calculation of the compensating quantity $u_{comp}$ takes place so that the resulting and corrected quantity that is applied to the load model 7 is calculated from the sum of the phase voltage $u_x$ and the compensating quantity $u_{comp,x}$. Hence, at a zero-crossing of the current, the equation:

$$u_x^* = u_x + u_{comp,x}$$

applies, whereas in contrast, when there is no zero-crossing of the current—no discontinuous mode—the following continues to apply:

$$u_x^* = u_x$$

Figure 6:
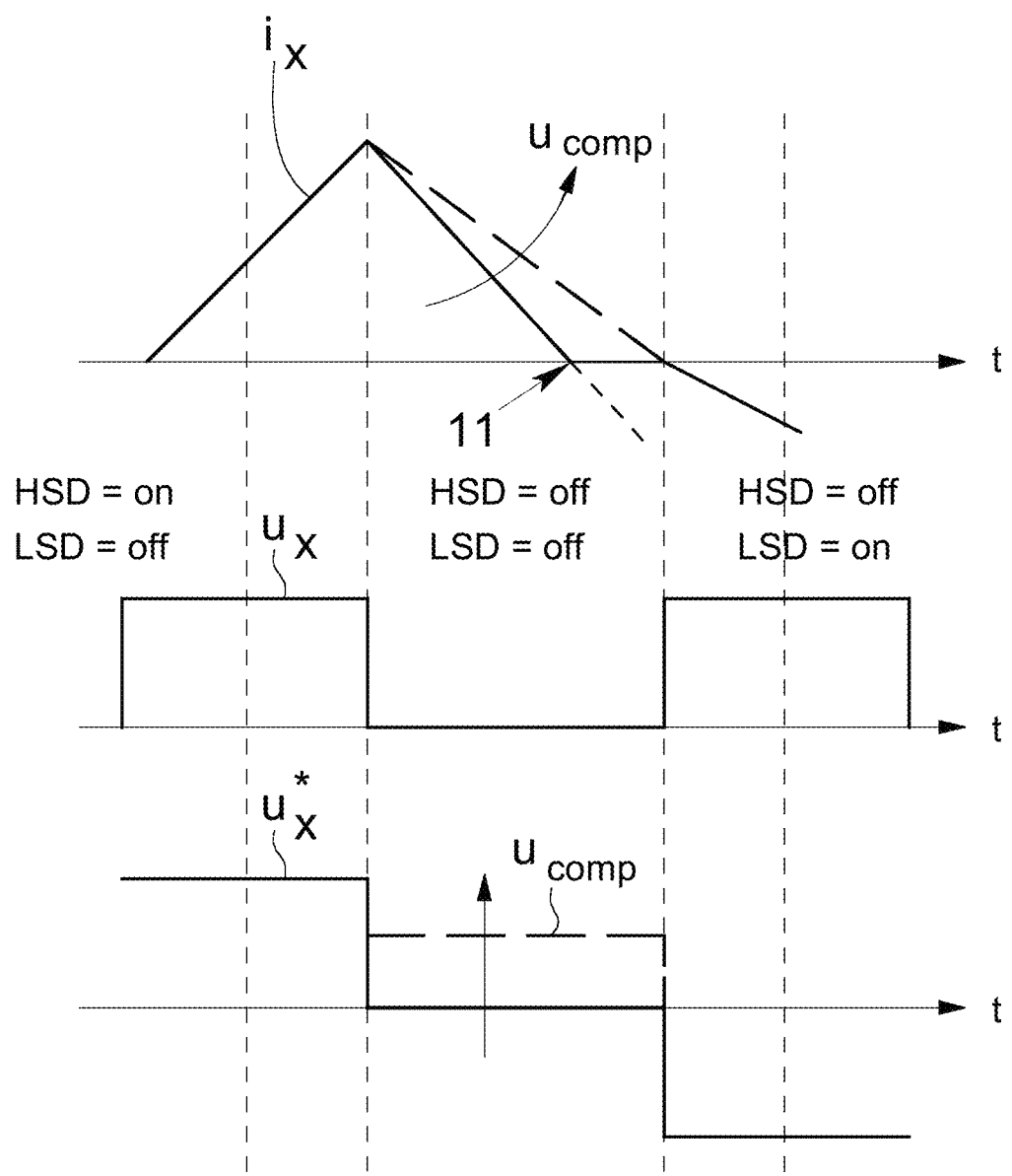
FIG. 6 schematically shows an effect of a calculated compensating voltage and additional imposition of the compensation voltage on the electrical load.

FIG. 6 illustrates the principle of operation of the observer 9 with a sketch of the curves of the converter control data in the form of PWM signals 6, the load current $i_x$, and the compensating quantity in the form of the compensating voltage $u_{comp}$. When the load current $i_x$ is calculated with only the simple load model 7, a zero-crossing of the current $i_x$, and thus the current discontinuity 11, is not detected. The load model 7 continues to calculate with the previously applicable descriptions according to the equations, essentially irrespective of the forced staying of the load current $i_x$ at zero, resulting in the incorrect current curve $i_x$, which is shown in a dotted line. The idea is to determine a compensating voltage $u_{comp}$ that, in combination with the converter voltage $u_x$, affects the calculation of the load current $i_x$ by the simple load model 7 in such a way that the same result is produced for the load current $i_x$ as though the discontinuous mode had already been taken into account in the load model 7. It is evident from FIG. 6 that the curve of the load current $i_x$ is raised—dashed curve of $i_x$—by the additional action of the compensating voltage such that the current at the end of the discontinuity interval has in fact dropped to zero and has not erroneously been calculated as negative.

The magnitude of the required compensating voltage $u_{comp}$ is quite simple to calculate, since an erroneously calculated current through a coil, the dotted curve of the load current $i_x$ in FIG. 6, corresponds to a voltage-time area, which is to say a voltage that has acted on the coil for a specific time in order to cause the (erroneous) change in current. With the knowledge that in the case of the three-phase load during the discontinuous mode ($i_x$=0) shown in FIG. 2, the voltage on the converter side at the load is equal to the common phase-to-neutral voltage $u_0$ of the three phases, and that the phase-to-neutral voltage can easily be calculated from:

$$u_0 = \frac{u_a + u_b + u_c}{3}$$

there remains only the question of the duration of the discontinuous mode, which is to say the question of the sum of the discontinuous mode time intervals $t_{zero}$.

Figure 7:
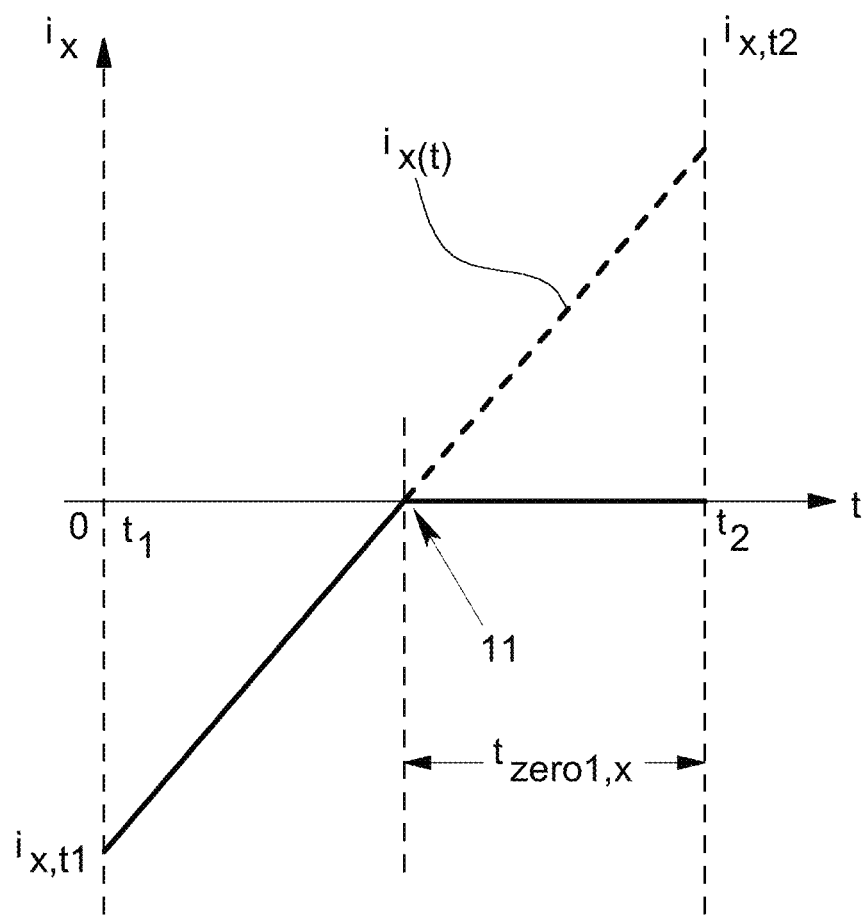
FIG. 7 shows the approximate calculation of the current zero-crossing under the assumption of a linear behavior of the load current.

FIG. 7 shows a curve for the load current $i_x$ calculated with the observer load model 10, wherein the values $i_{x,t1}$, $i_{x,t2}$ for the load current $i_x$ are known at the times $t_1$, $t_2$ at the beginning and at the end of the observer time interval because of the calculation. A zero-crossing of the load current $i_x$ can be inferred from the change in sign of the calculated load current $i_x$, which is then associated with a current discontinuity 11 if all power switches supplying the load are blocking in the observer time interval examined, which is assumed to be the case here. To avoid the necessity for a resource-intensive iterative method for determining the zero point, the curve of the current $i_x$ through the load in observer time intervals with a zero-crossing of the load current $i_x$ is approximated linearly, as is shown in FIG. 7. In this case the current discontinuity time interval $t_{zero1,x}$ can easily be calculated by the observer 9, since it is only necessary to determine the zero point of a straight line. For the situation shown in FIG. 7, the result for the current discontinuity time interval $t_{zero1}$ is:

$$t_{zero1,x} = \frac{abs(i_{x,t2})}{abs(i_{x,t1}) + abs(i_{x,t2})}(t_2 - t_1)$$

If another current discontinuity were to occur in a current discontinuity time interval $t_{zero2}$ with the interval boundaries t3 and t4, then the following would apply accordingly:

$$t_{zero2,x} = \frac{abs(i_{x,t4})}{abs(i_{x,t3}) + abs(i_{x,t4})}(t_4 - t_3)$$

Consequently, within the framework of an average-value model as the load model 7, which carries out only one calculation within a PWM period, the compensating voltage would be calculated from $$u_{comp,x} = \frac{t_{zero1,x} + t_{zero2,x}}{T_{PWM}} u_0$$

It is readily evident from the equations that when a compensating voltage $u_{comp}$ is calculated as a compensating quantity, the compensating voltage $u_{comp}$ depends in particular on the ratio of the current discontinuity time interval $t_{zero}$ (or the sum of the current discontinuity time intervals within the calculation interval) to the switching period duration $T_{PWM}$ of the converter. In multiphase systems, the calculation shown is carried out for each phase, with each phase having its own observer. The load model 7 has applied to it a voltage in which the compensating voltage $u_{comp,x}$ calculated by the observer 9 is added to the load voltage $u_x$ switched by the converter, so that the calculation of the load current $i_x$ with the load model 7 takes place on the basis of the summed voltage at the load.

Figure 8:
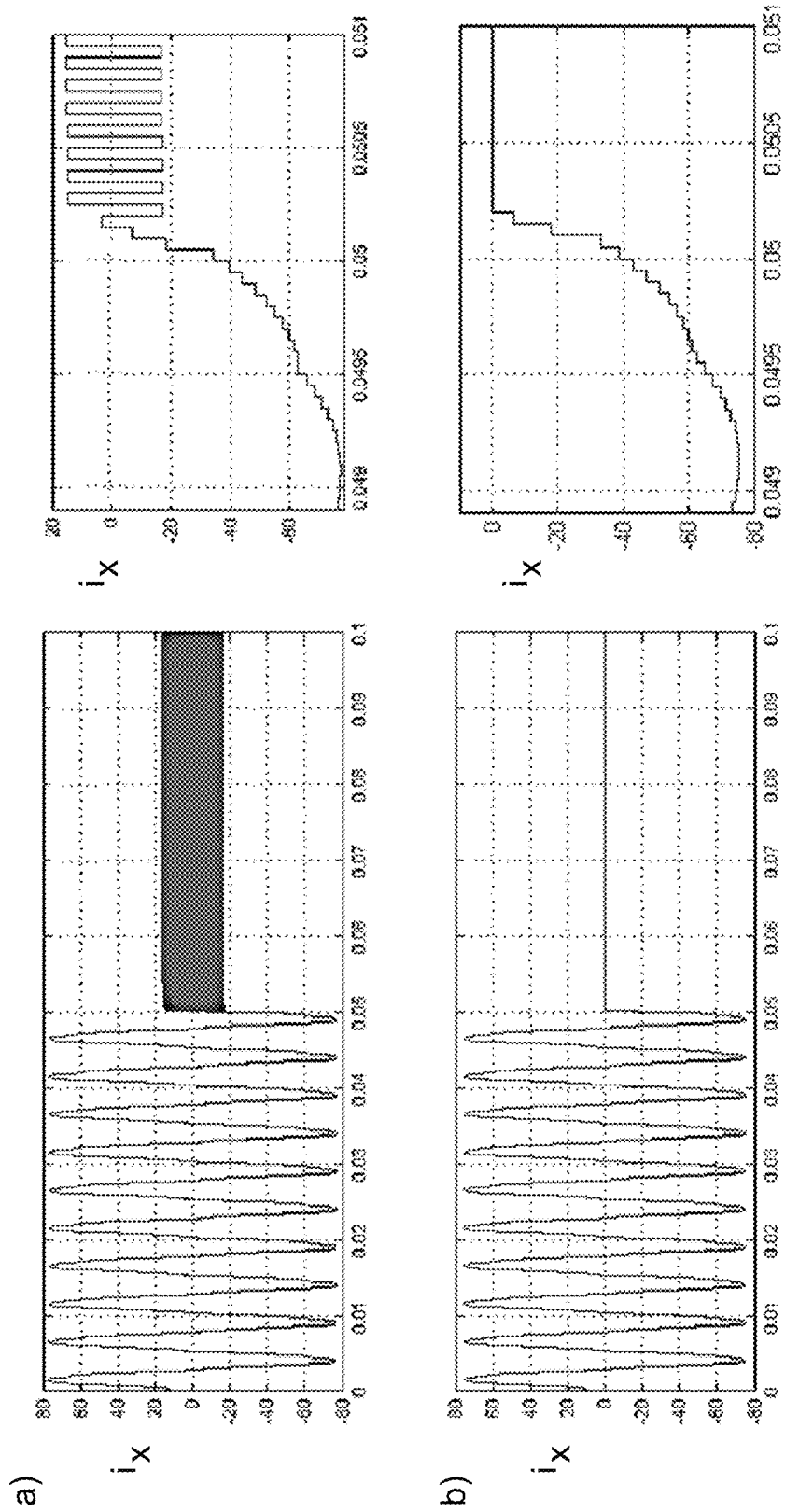
FIG. 8 shows the numerical calculation of a load current in one phase of an asynchronous machine with and without an observer load model.

FIG. 8 shows the calculation of the load current $i_x$ in a conventional manner, which is to say on the basis of a load model 7 that does not take the current discontinuity into account (FIG. 8a) and on the basis of the same load model 7, but which is additionally subjected to the compensating voltage $u_{comp,x}$ calculated by the described observer 9 (FIG. 8b). In both calculations, all power switches block starting from the point in time 50 ms. The uncorrected calculation in FIG. 8a ends in an erroneous continuous oscillation of the load current $i_x$, while in contrast the calculation corrected by the observer 9 leads to a correct stationary zero load current $i_x$.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A computer-implemented method for real-time testing of a control unit with a simulator, the simulator having a simulator I/O interface and the control unit having a control unit I/O interface, the control unit and the simulator being connected to one another through their I/O interfaces via at least one data channel, the method comprising:
   transmitting, via the control unit, converter control data to the simulator through the data channel;
   calculating by the simulator a load current and a load voltage as electrical load state variables via the converter control data and via an electrical load model that excludes current discontinuities caused by the converter;
   transmitting by the simulator at least a portion of the load state variables to the control unit;
   implementing a control observer on the simulator;
   calculating via the control observer at least the load current as a load state variable, based on the converter control data and an observer load model;
   detecting, via the control observer, a zero-crossing of the load current and a current discontinuity caused thereby from the calculated load current; and
   upon detection of a current discontinuity, calculating via the control observer an electrical compensating quantity such that when the compensating quantity is additionally applied to the electrical load in the load model, the calculation of the load current using the load model takes place with reduced error in the presence of current discontinuities.

2. The method according to claim 1, wherein the load modeled by the load model is a commutated machine, an asynchronous machine, or a synchronous machine, and wherein the phase or phases of the machine are mathematically reproduced by at least one RLC network or at least one RL network.

3. The method according to claim 1, wherein the calculation of the observer load model takes place in observer time intervals that are synchronized by external switching events of the converter that are determined by analysis of the converter control data.

4. The method according to claim 1, wherein the observer load model contains at least one explicit function for the load state variable to be calculated.

5. The method according to claim 4, wherein the explicit functions are solution functions for linear differential equations that constitute the observer load model.

6. The method according to claim 1, wherein the observer load model is an average-value model, or wherein the observer load model is calculated numerically.

7. The method according to claim 6, wherein the calculation of the observer load model is driven by load state variables calculated with the load model.

8. The method according to claim 1, wherein the control observer detects a zero-crossing of the load current and a current discontinuity caused thereby by a change in sign of the calculated load current by analyzing values of the load current at a beginning and at an end of observer time intervals during which no element of the converter is switched on by corresponding converter control data.

9. The method according to claim 8, wherein a behavior of the current in observer time intervals with a zero-crossing of the load current is approximated linearly.

10. The method according to claim 1, wherein the control observer calculates the current discontinuity time interval upon detection of a zero-crossing of the load current and of a current discontinuity caused thereby.

11. The method according to claim 10, wherein the control observer calculates a compensating voltage as the compensating quantity, wherein the compensating voltage depends in on a ratio of the current discontinuity time interval to the switching period duration of the converter.

12. The method according to claim 11, wherein the compensating voltage calculated by the control observer is added in the load model to the load voltage switched by the converter, so that the calculation of the load current with the load model takes place based on a summed voltage at the load.

13. The method according to claim 1, wherein the electrical load model is calculated with a processor of the simulator, and wherein the control observer is calculated with a different processor of the simulator or the control observer is calculated with an FPGA of the simulator.

* * * * *